United States Patent
Kao et al.

[11] Patent Number: 5,759,882
[45] Date of Patent: Jun. 2, 1998

[54] METHOD OF FABRICATING SELF-ALIGNED CONTACTS AND LOCAL INTERCONNECTS IN CMOS AND BICMOS PROCESSES USING CHEMICAL MECHANICAL POLISHING (CMP)

[75] Inventors: Dah-Bin Kao; John Pierce, both of Palo Alto, Calif.

[73] Assignee: National Semiconductor Corporation, Santa Clara, Calif.

[21] Appl. No.: 732,018

[22] Filed: Oct. 16, 1996

[51] Int. Cl.⁶ ............................................. H01L 21/8249
[52] U.S. Cl. ........................ 438/202; 438/633; 438/664
[58] Field of Search .............................. 438/202, 203, 438/633, 649, 655, 664, 683

[56] References Cited

U.S. PATENT DOCUMENTS

| | | | |
|---|---|---|---|
| 5,422,290 | 6/1995 | Grubisch | 438/202 |
| 5,587,338 | 12/1996 | Tseng | 438/664 |
| 5,593,919 | 1/1997 | Lee et al. | 438/633 |
| 5,654,216 | 8/1997 | Adrian | 438/633 |

OTHER PUBLICATIONS

C.T. Liu et al., "MOSFET's with One-Mask Sealed Diffusion–Junctions for ULSI Applications", IEEE Electron Device Letters, vol. 16 No. 8, pp. 363–365 Aug. 1995.

T.M. Liu et al., "A Half–micron Super Self–aligned BiCMOS Technology for High Speed Application", IEEE 2.2.1–2.2.4 pp. 23–26 Apr. 1992.

T.M. Liu et al., "An Ultra High Speed ECL–Bipolar CMOS Technology with Silicon Fillet Self–aligned Contacts", IEEE Symposium on VLSI Technology Digest of Technical Papers pp. 30–31 Apr. 1992.

T.M. Li et al., "The Control of Polysilicon/Silicon Interface Processed by Rapid Thermal Anneal", IEEE Bipolar Circuits and Technology Meeting May 1991.

Tzu-Yin Chiu et al., "Non-overlapping Super Self–Aligned BiCMOS with 87ps Low Power ECL", IEEE pp. 752–755 Aug. 1988.

*Primary Examiner*—Chandra Chaudhari
*Attorney, Agent, or Firm*—Limbach & Limbach L.L.P.

[57] ABSTRACT

A method of fabricating external contacts in an integrated circuit structure utilizes chemical mechanical polishing (CMP). The structure includes an active device substrate region defined by field oxides. First and second diffusions formed in the active region define a substrate surface region therebetween. In accordance with the method, a layer of amorphous or polycrystalline silicon is formed in contact with the diffusion regions, subjected to a chemical mechanical polishing (CMP) step and then etched to form external contacts. The process flow can be applied to CMOS technologies and adapted to bipolar technologies to provide a BiCMOS flow.

21 Claims, 10 Drawing Sheets

METHOD OF FABRICATING SELF-ALIGNED CONTACTS AND LOCAL INTERCONNECTS IN CMOS AND BICMOS PROCESSES USING CHEMICAL MECHANICAL POLISHING (CMP)

BACKGROUND OF THE INVENTION

1. Field of the Invention

The present invention relates to the fabrication of integrated circuit elements and, in particular, to an ultra self-aligned process flow in which chemical mechanical polishing (CMP) is used to fabricate self-aligned contacts and local intercnonects for CMOS and BiCMOS technologies.

2. Discussion of the Related Art

FIG. 1 shows a conventional MOSFET transistor 10 fabricated in an active device region of a silicon substrate, the active device region being defined by LOCOS field oxide regions 13 in the conventional manner. In fabricating the MOSFET 10, a layer of polysilicon is deposited over a layer of thin gate oxide that is formed on the surface of the substrate active device region. The polysilicon layer is then masked and the exposed polysilicon is etched to define a polysilicon gate region 12 that is separated from the substrate by gate oxide 14. A self-aligned implant of dopant of conductivity type opposite that of the substrate (N-type is shown) then forms lightly doped drain (LDD) regions in the substrate as a first phase in the formation of the MOSFET source/drain regions. After the formation of oxide sidewall spacers (SWS) 15 on the sidewalls of the polysilicon gate 12 and the gate oxide 14, a second implant (N+ is shown) is performed to set the conductivity of the polysilicon gate region 12 to a desired level and to complete the source/drain regions 16. A refractory metal, e.g. titanium, may then be deposited on the exposed upper surfaces of the source/drain regions 16 and the polysilicon gate region 12 and annealed, thereby causing the refractory metal to react with the underlying silicon of the source/drain regions 16 and with the doped polysilicon gate 12 to form metal silicide 18 on these surfaces. A layer of dielectric material 20, typically silicon oxide, is then formed, contact openings are etched in the dielectric 20 and a metallization layer 22 is formed and patterned to provide contacts to the silicide 18 on the source/drain regions 16 and on the polysilicon gate 12, thereby completing the MOSFET structure.

The above-described MOSFET fabrication technique suffers from potential problems in the formation of the source/drain regions 16. First, selective growth of the silicide needed for good contacts with the metallization layer requires a reaction between the refractory metal and underlying silicon. Therefore, the refractory metal must be formed on the silicon of the source/drain regions 16, requiring that these regions be wide enough to accommodate the photolithographic limitations of the contact opening, resulting in a wider device. Also, since silicon is consumed in the formation of the silicide, the junction depth of the source/drain regions 16 is difficult to control and dopant depletion can occur in these regions. Furthermore, formation of the deep, heavily-doped junction for the source/drain regions 16 can result in dopant diffusion under the gate region 12, thereby reducing the effective channel length of the MOSFET, i.e. the so-called "short channel effect."

Liu et al., "A Half-micron Super Self-aligned BiCMOS Technology for High Speed Applications", 1992 IEDM, pp. 23–26, have disclosed a BiCMOS technology with a compatible bipolar and CMOS process flow based upon local interconnects using polysilicon as external source/drain contacts. As discussed by Liu et al., after NMOS and DMOS LDD implants, a layer of amorphous or polycrystalline silicon (polysilicon) is deposited and a blanket anisotropic silicon etch is performed. A second layer of polysilicon is then deposited and patterned to form local interconnects and metal contact pads. N+ and P+ implants are then performed to dope the NMOS and PMOS source/drain polysilicon electrodes, respectively. A junction drive-in step outdiffuses dopants from the polysilicon electrodes to form the source/drain N+ shallow junctions in the substrate. The junction drive-in is a combination of furnace and rapid thermal anneal (RTA) processing. A silicidation process is then performed on the polysilicon gate and the external source/drain electrodes and a CMOS-compatible back-end process for contacts and multi-level interconnects is used to complete the CMOS devices. Bipolar processing proceeds in parallel.

Additional details of the Liu et al. process are provided by Liu et al., "An Ultra High Speed ECL-Bipolar CMOS Technology with Silicon Fillet Self-aligned Contacts", 1992 Symposium on VLSI Technology Digest of Technical Papers, pp. 30–31.

Use of external source/drain contacts offers several advantages over the conventional FIG. 1 MOSFET structure. First, it leads to smaller and faster devices by reducing the intrinsic source and drain areas and the associated junction capacitance. Second, it allows silicides and contact holes to be formed on the external source/drain regions over the field oxide and, at the same time, allows the formation of shallow junctions in the intrinsic source/drain regions to improve transistor characteristics. In addition, the shallow junction can be formed by using the external contact as the diffusion source.

The present invention provides a simpler and more scalable external source/drain process than that disclosed in the prior art.

SUMMARY OF THE INVENTION

The present invention, in general, provides a method of fabricating external contacts in an integrated circuit structure utilizing chemical mechanical polishing (CMP). The structure includes an active device substrate region defined by field oxide. First and second diffusion regions formed in the active region define a substrate surface region therebetween. In accordance with the method, a layer of amorphous or polycrystalline silicon is formed in contact with the diffusion regions, subjected to a chemical mechanical polishing (CMP) step, and then etched to form external contacts. The process flow can be applied to CMOS technologies and adapted to bipolar technologies to provide a BiCMOS flow.

A better understanding of the features and advantages of the present invention will be obtained by reference to the following detailed description and accompanying drawings which set forth an illustrative embodiment in which the principles of the invention are utilized.

BRIEF DESCRIPTION OF THE DRAWINGS

FIGS. 4A–4H are partial cross-sectional drawings illustrating a sequence of steps for fabricating self-aligned external source/drain CMOS technologies in accordance with the concepts of the present invention using thinner source/drain polysilicon than that used in the FIG. 2A–2H process.

DETAILED DESCRIPTION OF THE INVENTION

Several process flows for fabricating MOSFET devices having external source/drain contacts in accordance with the present invention will now be described. While no specific process parameters are provided in the description, those skilled in the art will appreciate that the concepts of the invention are applicable regardless of these parameters, which will differ depending upon the specific integrated circuit structure under manufacture. Those skilled in the art will also appreciate that, while the following description is directed to the fabrication of N-channel devices, the concepts of the invention apply to all MOSFET technologies, and to bipolar and BiCMOS technologies as well.

Figure 1:
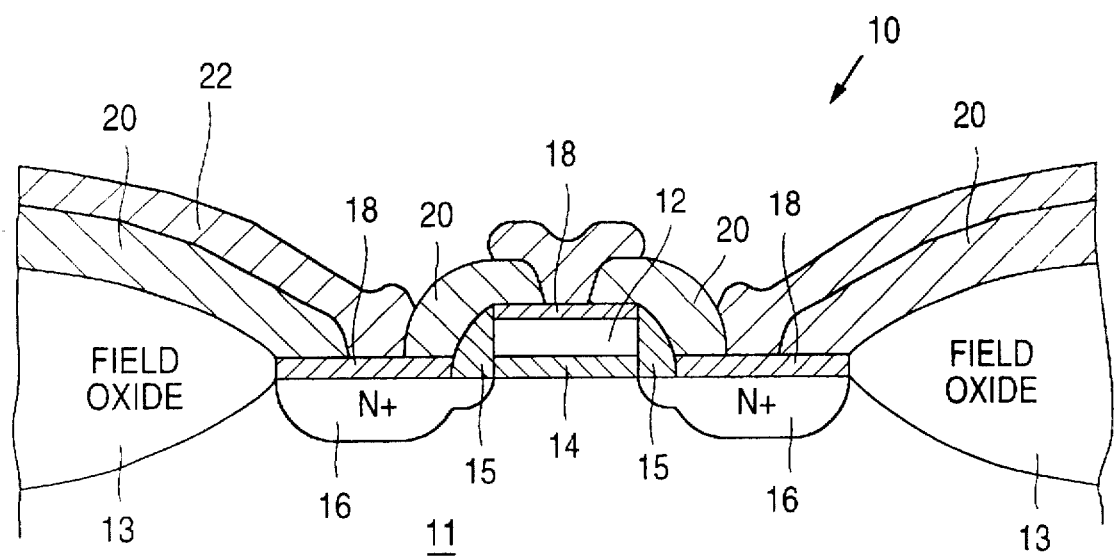
FIG. 1 is a partial cross-sectional drawing illustrating a conventional MOSFET design.
Figure 2A:
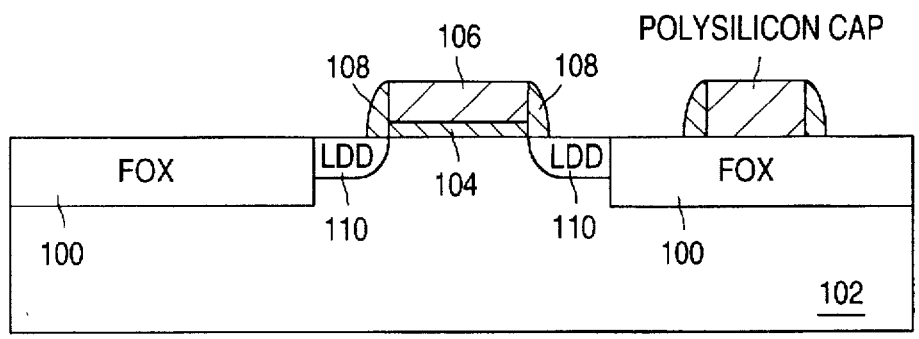
FIGS. 2A—2H are partial cross-sectional drawings illustrating a sequence of steps for fabricating self-aligned, external source/drain CMOS technologies in accordance with the concepts of the present invention.

Referring to FIGS. 2A–2H, the initial fabrication sequence for an external source/drain MOSFET configuration in accordance with the present invention proceeds in a conventional manner through the formation of the trench isolated preliminary MOSFET structure shown in FIG. 2A. As shown in FIG. 2A, conventional planarized trench isolation field oxide (FOX) regions 100 are formed in a silicon substrate 102. Thin gate oxide 104 is formed on the substrate 102 to electrically insulate an undoped polysilicon gate 106 from the substrate 102. Oxide sidewall spacers (SWS) 108 are formed on the sidewalls of the polysilicon gate 106 and the gate oxide 104. Lightly doped drain (LDD) N– regions 110, self-aligned to the gate 106, are formed in the substrate 102 adjacent field oxide regions 100 and beneath the sidewall spacers 108 to define a MOSFET channel region in the substrate 102 beneath the gate 106.

As further shown in FIG. 2A, the first layer of polysilicon can also utilized to form polysilicon capacitors on the field oxide regions 100.

Figure 2B:
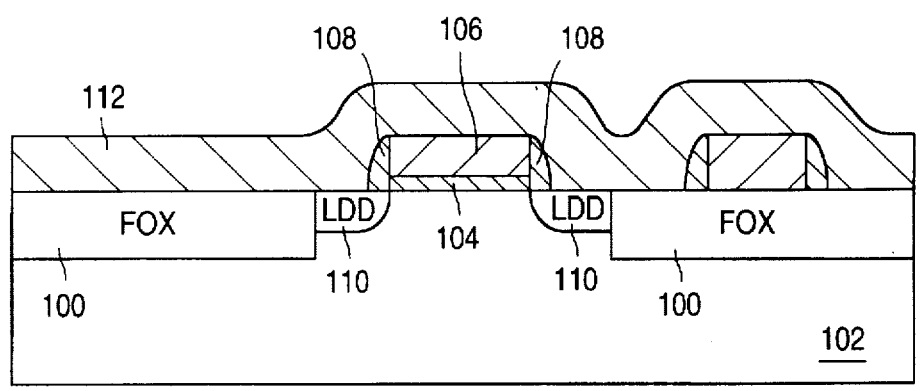
Figure 2C:
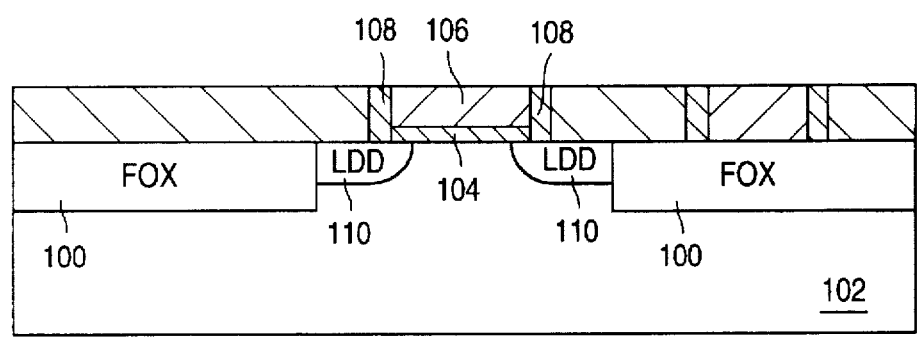

Referring to FIG. 2B, in accordance with the invention, a layer of amorphous or polycrystalline silicon (polysilicon) film 112 is then deposited on the FIG. 2A structure and a chemical mechanical polishing (CMP) step is performed. The thickness of the polysilicon film 112 is such that the CMP step results in a planarized surface, as shown in FIG. 2C.

Figure 2D:
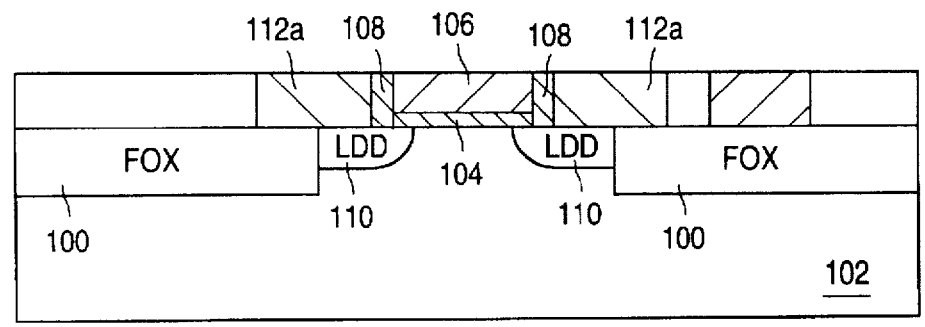

In the next step in the process, the two polysilicon layers are patterned to isolate devices and to eliminate excess capacitance, the mask protecting the gate area as well. The gaps between polysilicon are then filled with oxide and a CMP step is performed to planarize the surface, resulting in the definition of polysilicon external source/drain contacts 112a that are self-aligned to the LDD N-intrinsic source/drain regions 110, as shown in FIG. 2D.

Figure 2E:
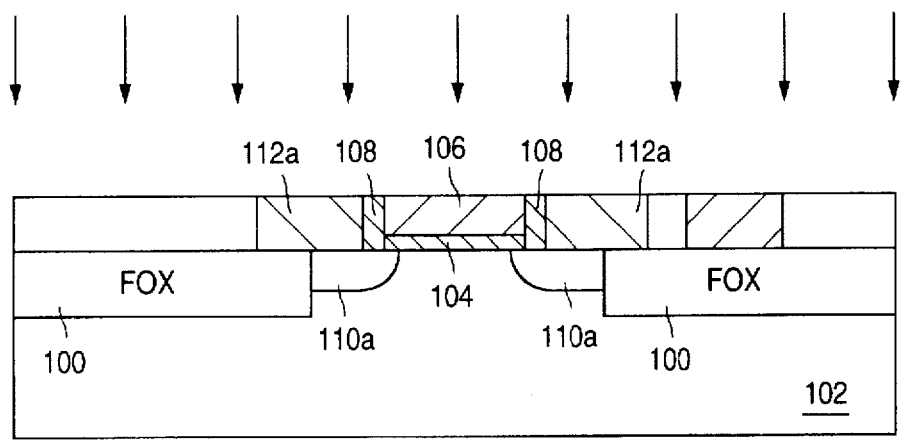

As shown in FIG. 2E, an N+ dopant, preferably arsenic, is then implanted into the gate polysilicon 106 and into the external source/drain contacts 112a to dope these regions to a desired conductivity level. A rapid thermal anneal (RTA) step is then performed to activate the N+ implant and to outdiffuse the N+ dopant from the polysilicon external source/drain contacts 112a to form shallow N+ junction regions 110a, resulting in the structure shown in FIG. 2E. Those skilled in the art will appreciate that a combination of RTA and furnace anneal can be used and that the N+ junction can be either deeper or shallower than the LDD regions.

Figure 2F:
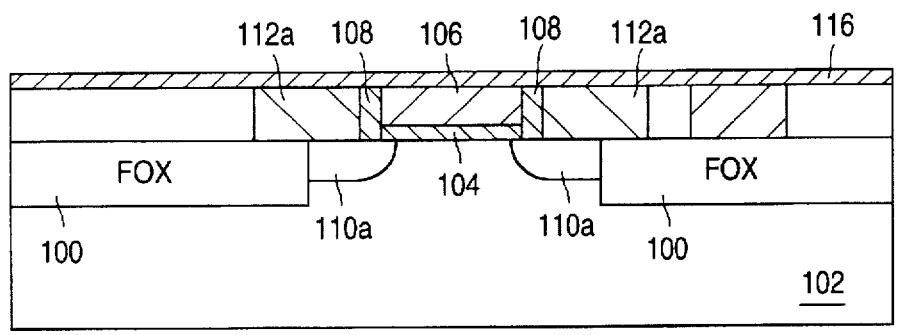
Figure 2G:
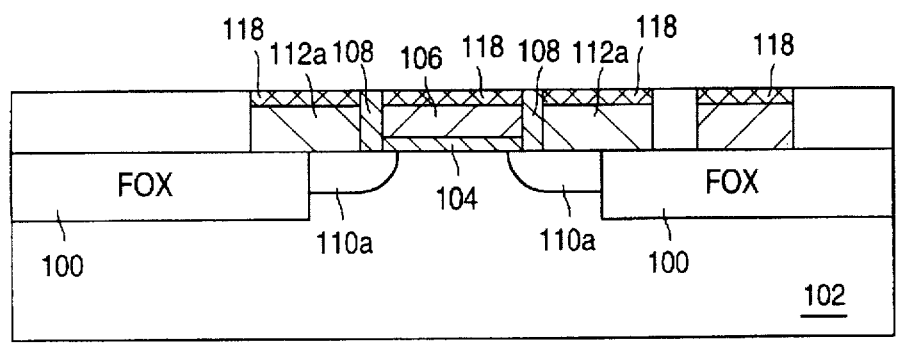

Next, as shown in FIG. 2F, a refractory metal (e.g. titanium) film is deposited over the entire FIG. 2E structure and second rapid thermal anneal step is performed to selectively form silicide 118 on the external source/drain polysilicon contacts 112a and on the polysilicon gate region 106. Since the N+ implant step described above in conjunction with FIG. 2E is performed on the external source/drain contacts 112a, rather than directly on the LDD regions 110, the implant energy and dose can be chosen without much impact on short channel effects. Therefore, the dopant depletion problem normally associated with salicidation is no longer an issue. The unreacted refractory metal is then removed using a conventional wet selective etch, resulting in the structure shown in FIG. 2G.

Figure 2H:
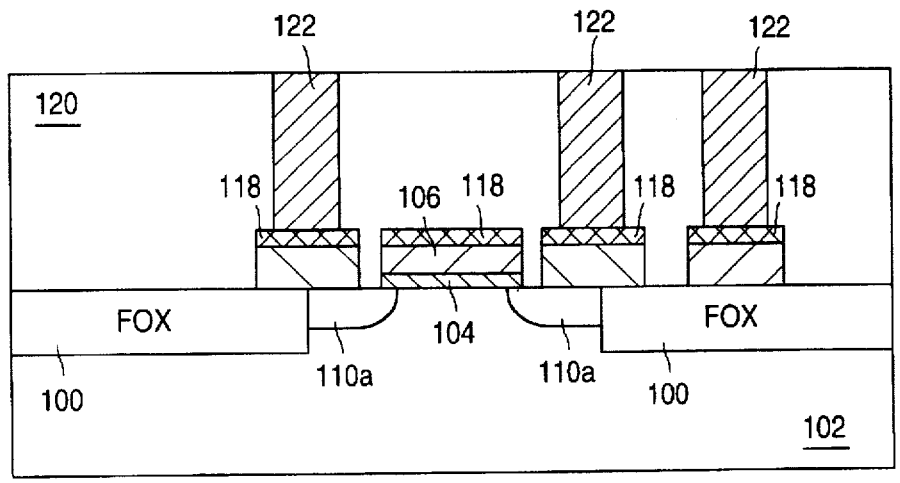

After removal of the unwanted refractory metal, a layer of dielectric material 120, e.g. silicon oxide, is deposited and an optional chemical mechanical polishing (CMP) step is performed to again planarize the structure. Finally, as shown in FIG. 2H, contact holes are opened in the dielectric layer 120 and a metallization structure is deposited to form contacts with the silicide 118 formed on the polysilicon external source/drain regions 112a and on the polysilicon gate 106. In the embodiment of the invention illustrated in FIG. 2H, the contact metallization could include a first layer of titanium, a second layer of titanium nitride, tungsten plugs 122 and a final layer of aluminum (not shown).

Figure 3A:
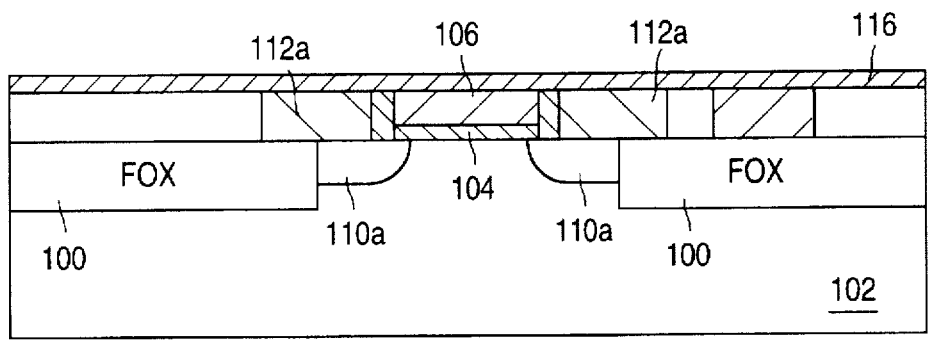
FIGS. 3A–3C are partial cross-sectional drawings illustrating a sequence of steps for an embodiment of the salicidation module of the FIG. 2A–2H process flow.
Figure 3B:
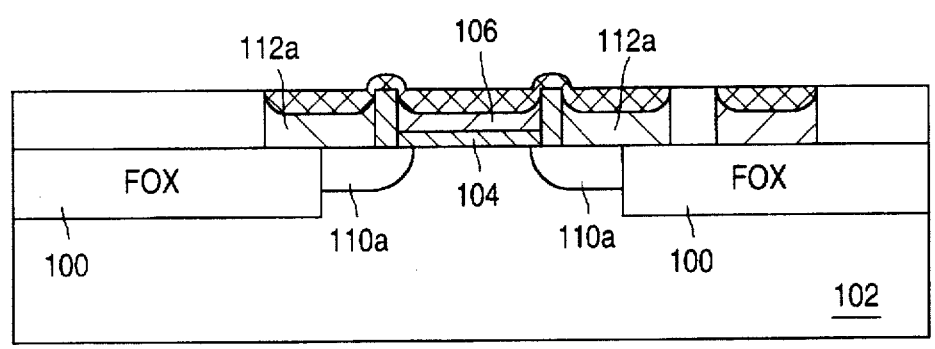
Figure 3C:
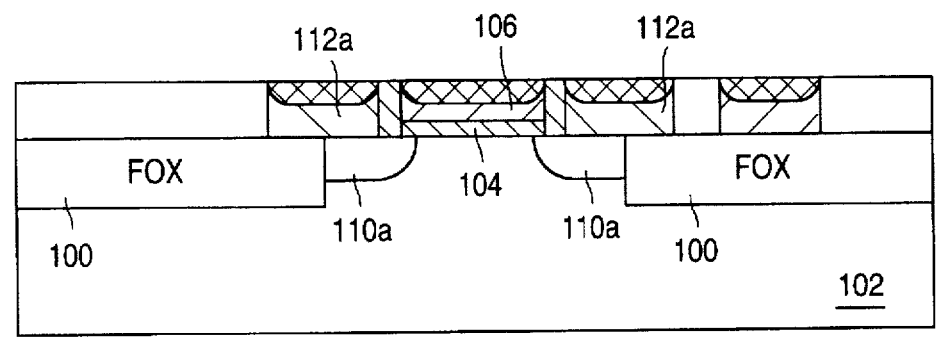

FIGS. 3A–3C show details of an optional module for formation of salicide in the FIG. 2A–2H process. After formation of the layer of refractory metal 116 (FIG. 3A) as described above, a conventional rapid thermal anneal step is performed and unreacted metal is selectively etched (FIG. 3B). The rapid thermal anneal steps are followed by a light chemical mechanical polishing (CMP) step to eliminate potential silicide crawl-outs, resulting in the structure shown in FIG. 3C.

FIGS. 4A–4H show minor variations in the FIG. 2A–2H process in which the external source/drain polysilicon layer is thinner than the gate polysilicon and the silicide wraps around the edges of the polysilicon lines.

Figure 4A:
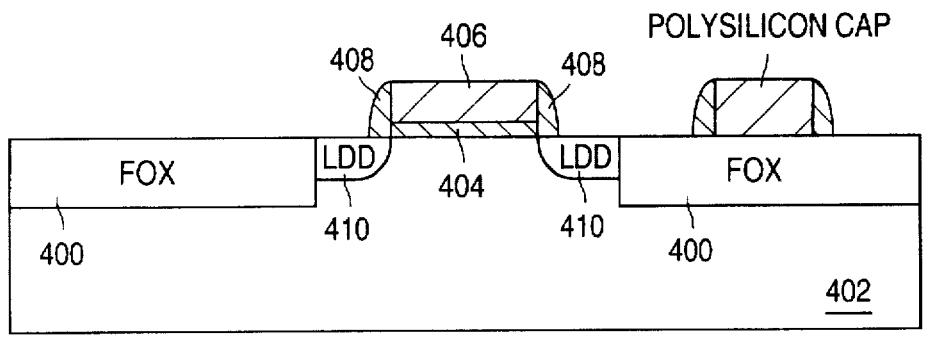

Specifically, referring to FIG. 4A, as in the case of the FIG. 2A–2H process, the initial fabrication sequence proceeds in a conventional manner through the formation of a trench isolated MOSFET structure. As shown in FIG. 4A, conventional planarized trench isolation field oxide (FOX) regions 400 are formed in a silicon wafer 402. Thin gate oxide 404 is formed on the substrate 402 to electrically insulate the undoped polysilicon gate 406 from the substrate 402. Oxide sidewall spacers (SWS) 408 are formed on the sidewalls of the polysilicon gate 406 and the gate oxide 404. Lightly doped drain (LDD) or drain extension N– regions 410 are formed in the substrate 402 adjacent to field oxide regions 400 and beneath the sidewall spacers 408 to define a MOSFET channel region in the substrate 402 beneath a polysilicon gate 406. As further shown in FIG. 4A, the first layer of polysilicon can also be utilized in the formation of polysilicon capacitors on the field oxide regions 400.

Figure 4B:
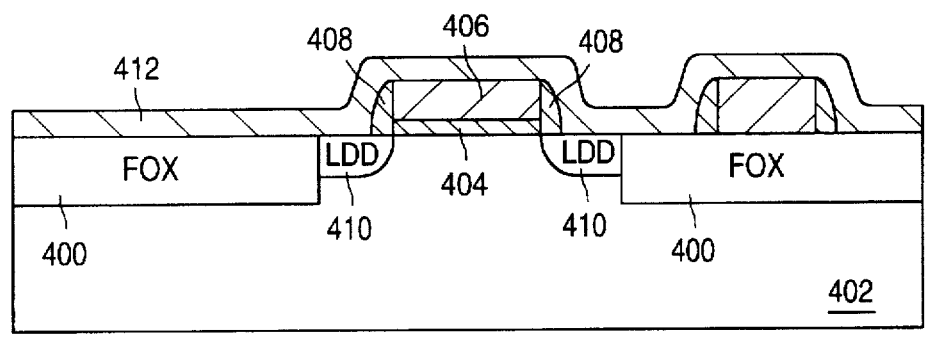
Figure 4C:
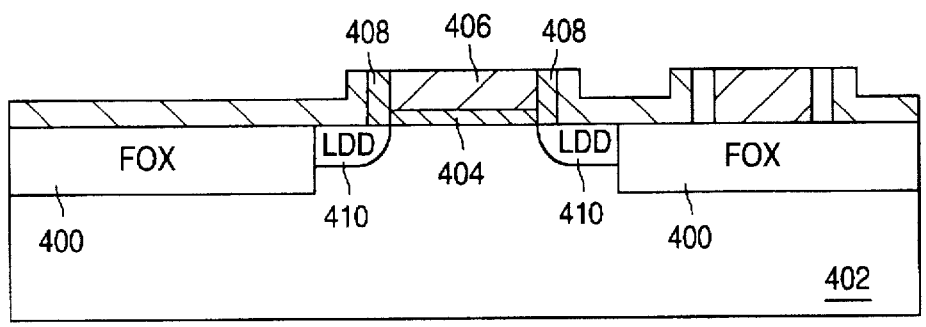

Referring to FIG. 4B, a layer of polysilicon film 412 is then deposited over the FIG. 4A structure. As shown in FIG.

4B, the thickness of the polysilicon film 412 is less than the thickness of the gate polysilicon 406. A chemical mechanical polishing (CMP) step is then performed, resulting in the structure shown in FIG. 4C.

Figure 4D:
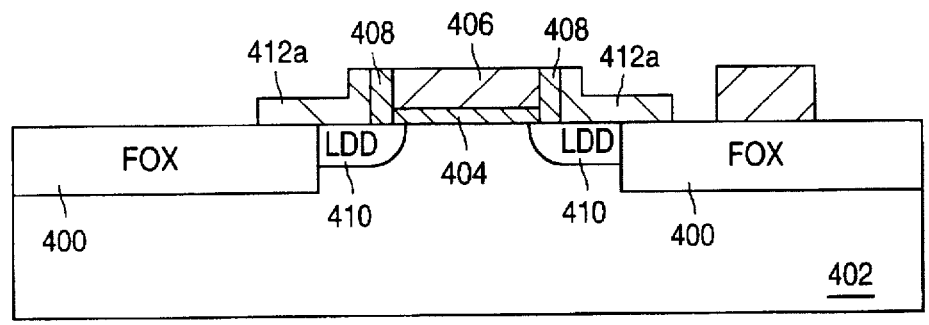

Next, the two polysilicon layers are patterned to isolate devices, resulting in the definition of polysilicon external source/drain contacts 412a that are self-aligned to the LDD N− intrinsic source/drain regions 410, as shown in FIG. 4D.

Figure 4E:
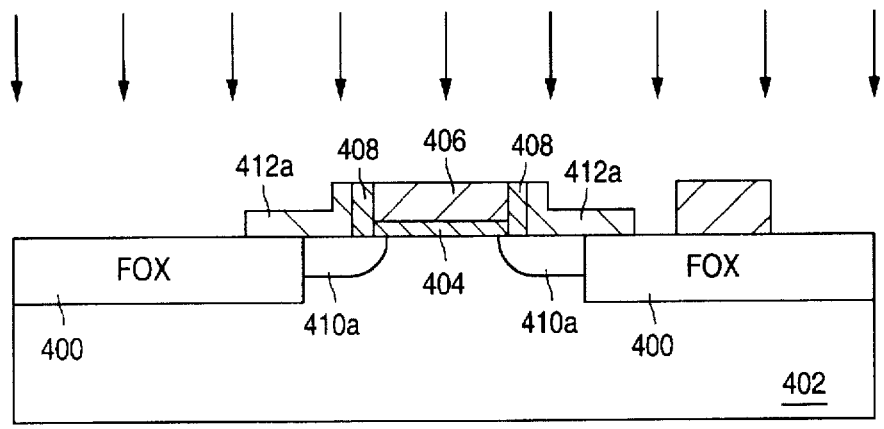

As shown in FIG. 4E, an N+ dopant, preferably arsenic, is then implanted into the gate polysilicon 406 and into the external source/drain contacts 412A to dope these regions of exposed polysilicon to a desired level. A rapid thermal anneal (RTA) step is then performed to activate the N+ implant and to outdiffuse the N+ dopant from the polysilicon external source/drain contacts 412a to form a shallow N+ junction region 410a, resulting in the structure shown in FIG. 4E.

Figure 4F:
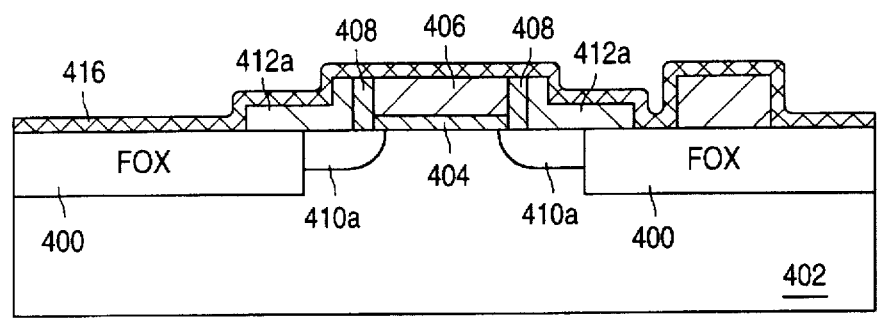
Figure 4G:
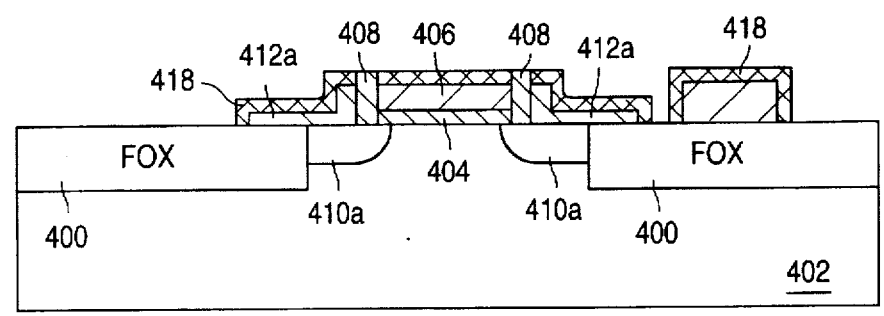
Figure 4G:
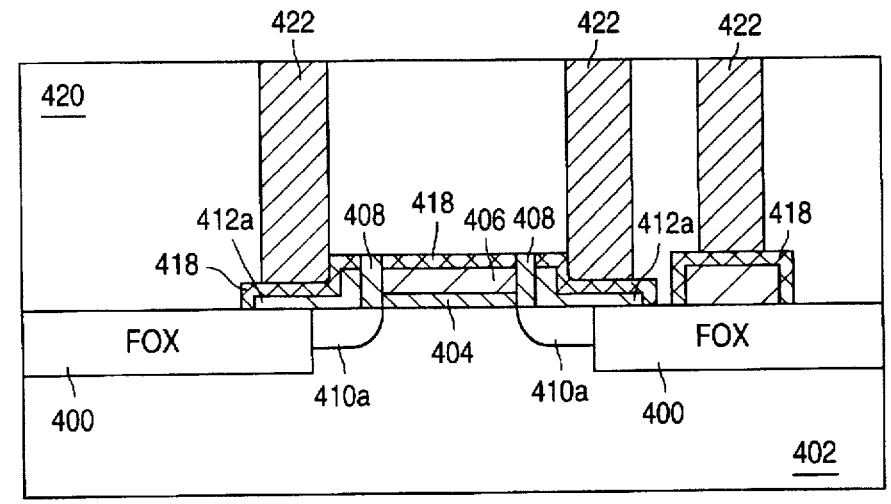

Next, as shown in FIG. 4F, a refractory metal (e.g., Titanium) film is deposited over the entire FIG. 4E structure and a second rapid thermal anneal step is performed to selectively form a salicide 418 on the external source/drain polysilicon contacts 412a and on the polysilicon gate region 106. Since the N+ implant step described above in conjunction with FIG. 4E is performed on the external source/drain contacts 412a, rather than directly on the LDD regions 410, the implant energy and dose can be chosen without much impact on short channel effects. The unreacted refractory metal is then removed using a conventional wet etch, resulting in the structure shown in FIG. 4G.

After removal of the unwanted refractory metal, a layer of dielectric material 420, e.g., silicon oxide, is deposited and a chemical mechanical polishing step is performed to again planarize the structure. Finally, as shown in FIG. 4H, contact holes are opened in the dielectric layer 420 and a metallization structure is deposited to form contacts with the silicide 418 on the polysilicon external source/drain regions 412a and on the polysilicon gate 106.

An embodiment of a process sequence using the concepts of the present invention in a bipolar flow is illustrated in FIGS. 5A–5H.

Figure 5A:
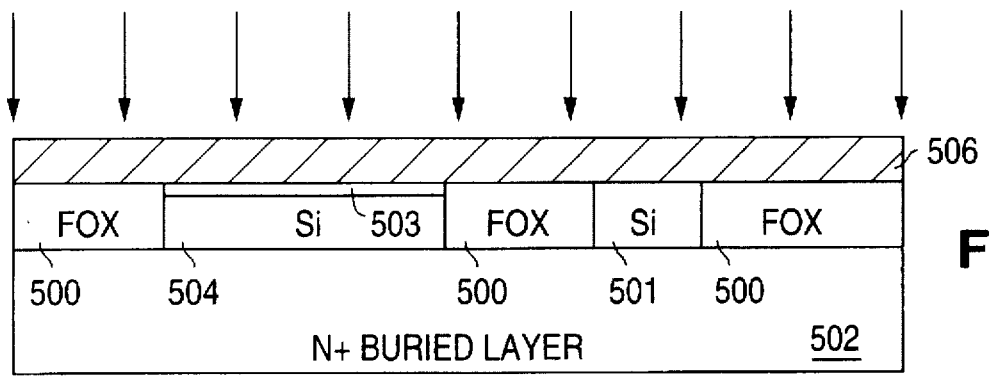
FIGS. 5A–5I are partial cross-sectional drawings illustrating a sequence of steps for fabricating bipolar technologies in accordance with the concepts of the FIG. 2A–2H process flow.

Referring to FIG. 5A, a bipolar process in accordance with the present invention proceeds in the conventional manner through the formation of a first layer of polysilicon. That is, as shown in FIG. 5A, trench isolation field oxide regions 500 formed over N+ buried layer 502 define silicon regions 504. The N+ region 501 connects the buried layer to the collector contact. The p-type region 503 is the base region. The first layer of polysilicon 506 is then implanted with N+ dopant to achieve a desired conductivity level.

Figure 5B:
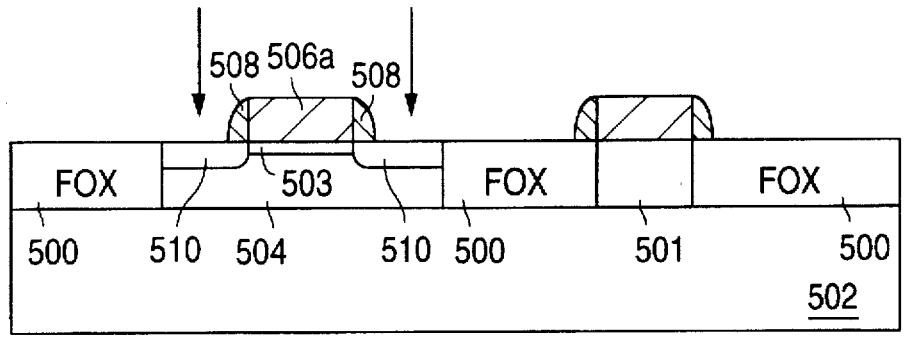

Referring to FIG. 5B, the doped polysilicon layer 506 is then patterned to define polysilicon region 506a. After formation of oxide sidewall spacers 508, self-aligned extrinsic base regions 510 are formed in a conventional manner.

Figure 5C:
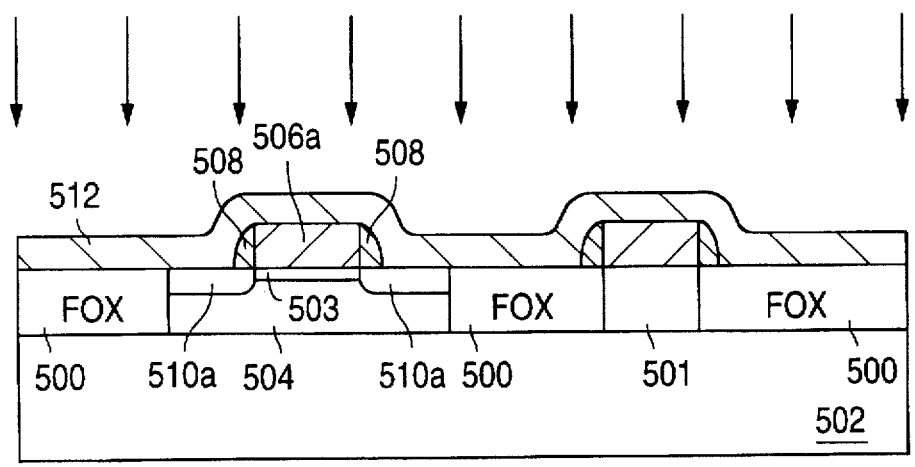

Next, shown in FIG. 5C, a layer of polysilicon film 512 is deposited over the FIG. 5B structure and P+ dopant, preferably BF$_2$ or Boron, is implanted into the polysilicon film 512.

Figure 5D:
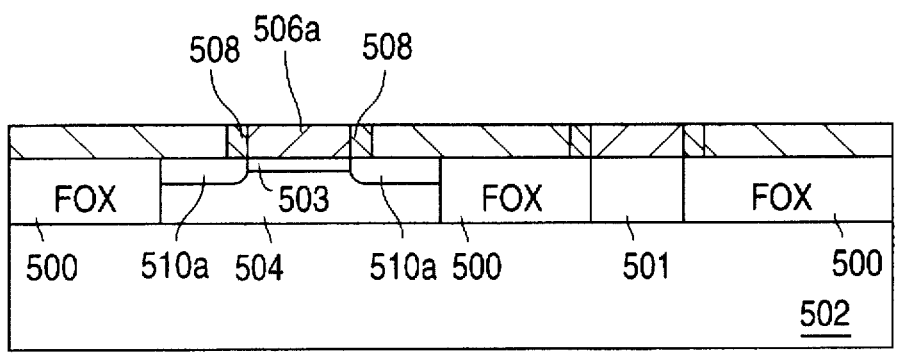

Referring to FIG. 5D, a chemical mechanical polishing (CMP) step is then performed to planarize the surface, the thickness of the polysilicon film 512 being such that the CMP step results in a planarized surface, as shown in FIG. 5D. (Of course, one skilled in the art will appreciate that a thinner poly2 layer may be utilized, preferably consistent with the FIG. 2A–2H process flow.)

Figure 5E:
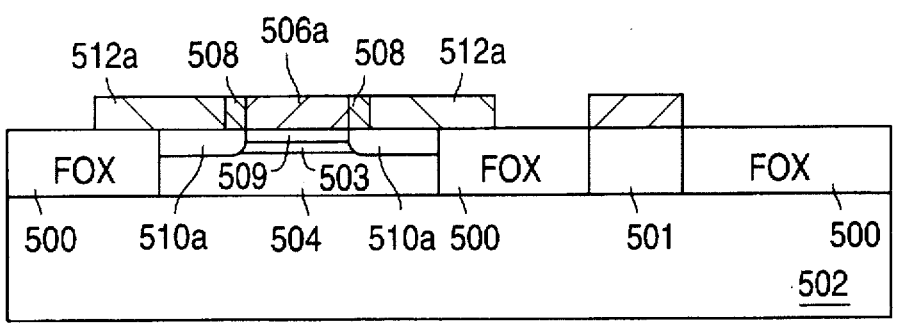

As shown in FIG. 5E, a diffusion step (combination of rapid thermal and furnace anneal) is then performed to activate the N+ and P+ implants and to outdiffuse the N+ and P+ dopants from the polysilicon 506 and 512, respectively, to form shallow N+ emitter region 509 and P+ external base regions 510.

In the next step in the process, the two polysilicon layers are patterned to isolate devices and to eliminate excess capacitances, resulting in the definition of polysilicon external contacts 512a that are self-aligned to the intrinsic N+ and P+ regions 510a, as shown in FIG. 5E.

Figure 5F:
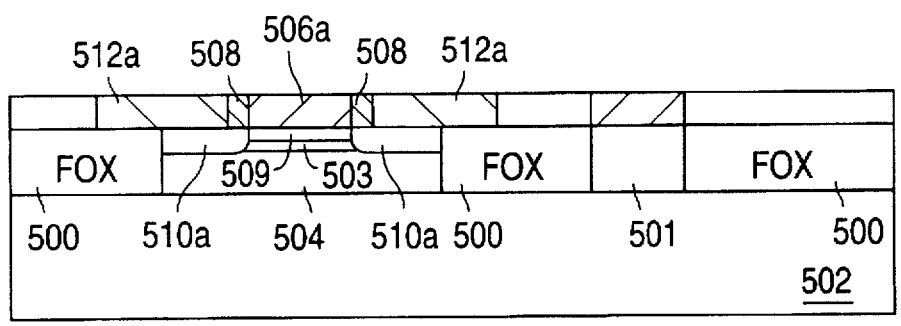
Figure 5G:
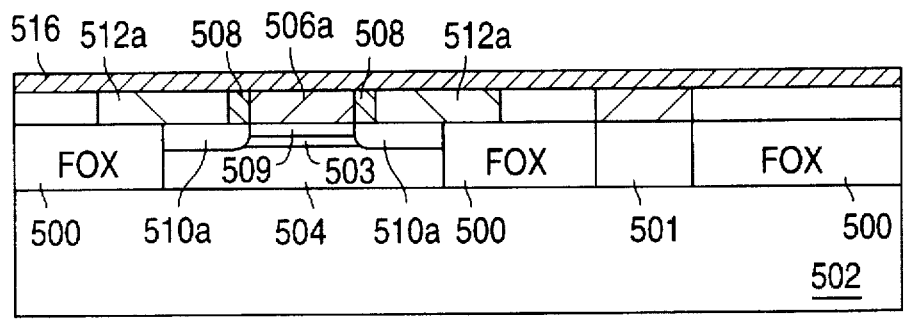
Figure 5H:
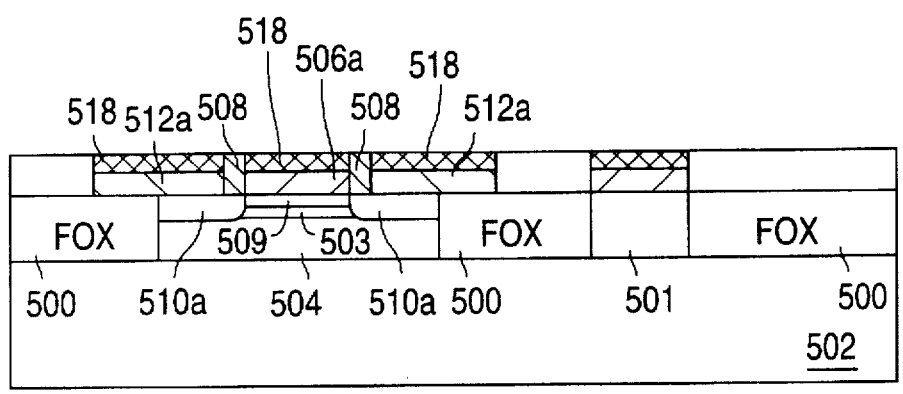

The gaps between polysilicon are then filled with oxide and a CMP step is performed to planarize the surface, as shown in FIG. 5F. Next, as shown in FIG. 5G, a refractory metal (e.g., titanium) film is deposited over the entire FIG. 5F structure and a rapid thermal anneal step is performed to selectively form salicide 518 on the external polysilicon contacts 512a and on the polysilicon region 506a. The unreacted refractory metal is then removed using a conventional wet selective etch, resulting in the structure shown in FIG. 5H.

Figure 5I:
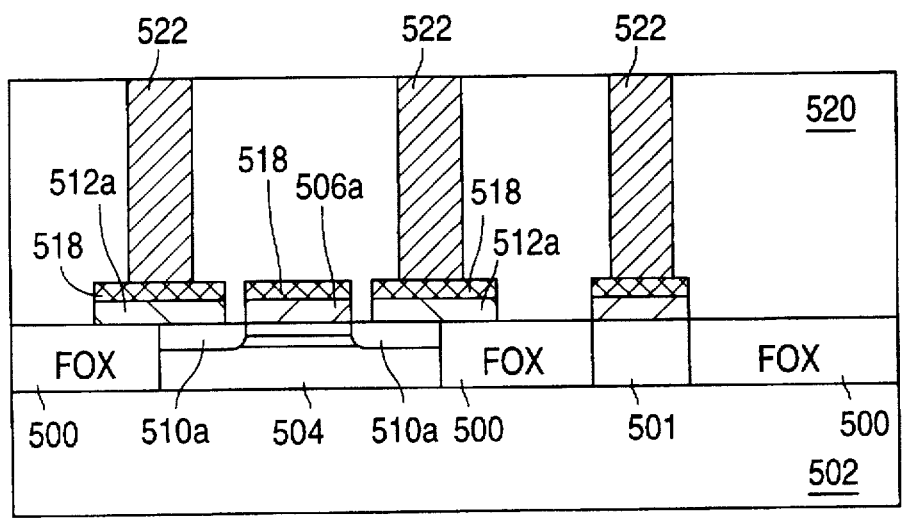
Figure 6A:
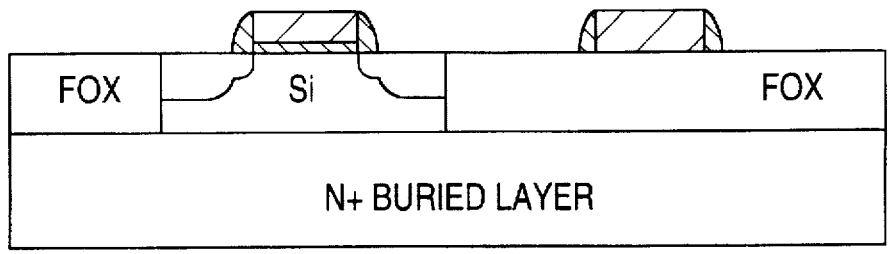
FIGS. 6A–6D are partial cross-sectional drawings illustrating a sequence of steps for an alternate embodiment of a module for forming self-aligned local interconnects in accordance with the concepts of the present invention using metals or other material instead of polysilicon.
Figure 6B:
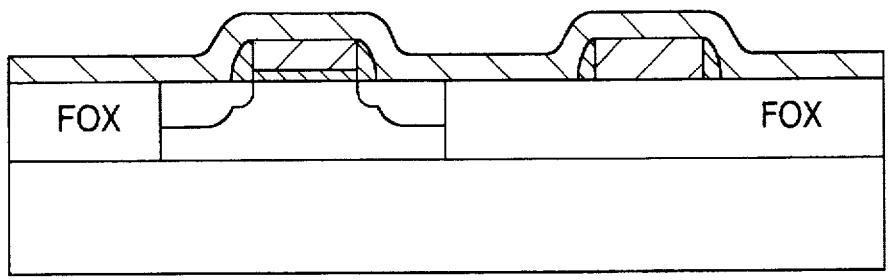
Figure 6C:
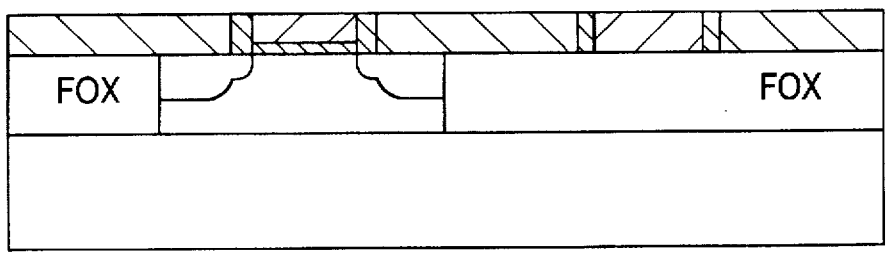
Figure 6D:
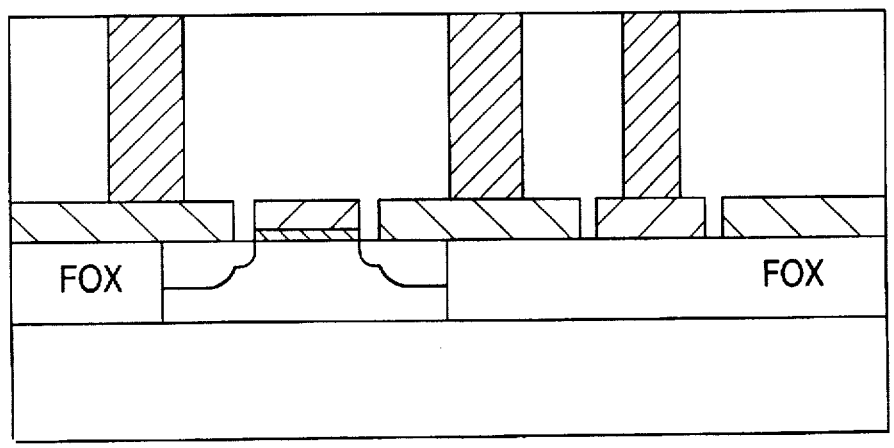

After removal of the unwanted refractory metal, a layer of dielectric material 520, e.g., silicon oxide, is deposited and a chemical mechanical polishing (CMP) step is performed to again planarize the structure. Finally, as shown in FIG. 5I, contact holes are opened in the dielectric layer 520 and a metallization structure is deposited to form contacts 522 with the silicide 518 formed on the polysilicon external regions 512a and on the polysilicon region 506a. A BiCMOS process may be obtained by combining the process flow described above in conjunction with FIGS. 2A–2H and the FIG. 5A–5H process flow.

The above describes an NPN. Those skilled in the art will readily appreciate that the flow can easily be converted to a PNP process by reversing the dopant types.

FIGS. 6A–6D illustrate an alternative embodiment of forming shallow junctions in accordance with the concepts of the present invention, but without the use of silicides. It should be noted that besides polysilicon or amorphous silicon, refractory metals or suicides such as tungsten silicide can also be used as the external contact to the intrinsic source/drain regions in the CMOS technologies or the emitter/base regions in the bipolar technologies.

Note also that in the description above, the two amorphous silicon layers may be utilized to form a lateral capacitor with the spacer oxide as a dielectric. With proper layout, this capacitor can also be used as a circuit element.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A method of fabricating external contacts in an integrated circuit structure, wherein the integrated circuit structure includes first and second spaced-apart field oxide isolation regions formed in a semiconductor substrate to define an active device substrate region therebetween, substrate diffusion regions formed in the active device substrate region to define a substrate surface region therebetween, a layer of silicon oxide formed on the substrate surface region, a first polysilicon region formed on the layer of silicon oxide, and oxide sidewall spacers formed on sidewalls of the first polysilicon region and the layer of silicon oxide, the method comprising:

(a) forming a layer of polysilicon over the above-described structure;

(b) performing a chemical mechanical polishing step to remove a first portion of the layer of polysilicon while leaving second and third portions of the polysilicon layer in contact with the first and second substrate diffusion regions, respectively; and (c) patterning the second and third portions of the polysilicon layer to define first and second polysilicon external contact regions such that the first polysilicon external contact region is in contact with the first substrate diffusion region and extends over at least a portion of the first field oxide isolation region, and the second polysilicon external contact region is in contact with the second substrate diffusion region and extends over at least a portion of the second field oxide isolation region.

2. A method as in claim 1 and wherein, following the step of performing a chemical mechanical polishing, the first polysilicon region and the second and third portions of the polysilicon layer are the same thickness.

3. A method as in claim 1 and wherein, following the step of performing a chemical mechanical polishing, the thickness of the first polysilicon region is greater than the thickness of the second and third portions of the polysilicon layer.

4. A method as in claim 1 and further comprising:

following the patterning step, introducing dopant into the first and second polysilicon external contact regions; and performing a rapid thermal anneal step such that dopant introduced into the first and second polysilicon external contact regions outdiffuses from the first and second polysilicon external contact regions into the first and second substrate diffusion regions, respectively.

5. A method as in claim 1 and further comprising:

forming refractory metal silicide on an upper surface of each of the first polysilicon region and the first and second polysilicon external contact regions.

6. A method as in claim 5 and wherein the step of forming refractory metal silicide comprises:

forming a layer of refractory metal on the surface of the structure resulting from step (c) in claim 1;

performing a rapid thermal anneal step such that the layer of refractory metal reacts to form refractory metal silicide on the upper surface of each of the first polysilicon region and the first and second polysilicon external contact regions, unreacted refractory metal remaining on portions of the structure resulting from step (c) in claim 1; and removing unreacted refractory metal.

7. A method as in claim 6 and including the subsequent steps of:

performing a chemical mechanical polishing step whereby silicide crawl-out is removed.

8. A method as in claim 6 and further comprising:

forming a separate, electrically-insulated conductive contact to each of the first polysilicon region and the first and second polysilicon external contact regions.

9. A method as in claim 1 and wherein the field oxide isolation regions comprise trench isolation oxide regions.

10. A method of fabricating external contacts in an integrated circuit structure, wherein the integrated circuit structure includes first and second spaced-apart field oxide isolation regions formed in a semiconductor substrate to define an active device substrate region therebetween, first and second spaced-apart substrate diffusion regions formed in the active device substrate region to define a substrate surface region therebetween, a layer of dielectric material formed on the substrate surface region, a region of first conductive material formed on the layer of dielectric material, and dielectric sidewall spacers formed on sidewalls of the region of first conductive material and the layer of dielectric material, the method comprising:

(a) forming a layer of second conductive material over the above-described structure;

(b) performing a chemical mechanical polishing step to remove first portions of the layer of second conductive material while leaving second and third portions of the layer of second conductive material in contact with the first and second substrate diffusion regions, respectively; and (c) patterning the second and third portions of the layer of second conductive material to define first and second external contact regions such that the first external contact region is in contact with the first substrate diffusion region and extends over at least a portion of the first field oxide isolation region, and the second external contact region is in contact with the second substrate diffusion region and extends over at least a portion of the second field oxide isolation.

11. A method as in claim 10 and wherein the first conductive material comprises polysilicon.

12. A method as in claim 10 and wherein the second conductive material comprises undoped polysilicon.

13. A method as in claim 10 and wherein the second conductive material comprises doped polysilicon.

14. A method as in claim 10 and wherein the second conductive material comprises a refractory metal silicide.

15. A method as in claim 10 and wherein the second conductive material comprises a refractory metal.

16. A method as in claim 10 and wherein the second conductive material comprises a metal.

17. A method as in claim 16 and wherein the metal comprises tungsten or aluminum.

18. A method as in claim 10 and wherein the second conductive material comprises a multi-layer structure.

19. A method as in claim 18 and wherein the multi-layer structure comprises titanium, titanium nickel alloy and aluminum.

20. A method of fabricating external source/drain contacts in an MOS transistor integrated circuit structure, wherein the integrated circuit structure includes first and second spaced-apart field oxide isolation regions formed in a silicon substrate to define an active device substrate region therebetween, first and second spaced-apart LDD substrate diffusion regions formed in the active device substrate region to define a substrate channel region therebetween, a layer of gate oxide formed on the substrate channel region, a polysilicon gate region formed on the layer of gate oxide, and oxide sidewall spacers formed on sidewalls of the polysilicon gate region and the layer of gate oxide, the method comprising:

(a) forming a layer of polysilicon over the above-described structure;

(b) performing a chemical mechanical polishing step to remove first portions of the layer of polysilicon while leaving second and third portions of the polysilicon layer in contact with the first and second LDD substrate diffusion regions, respectively;

(c) patterning the second and third portions of the polysilicon layer to define first and second polysilicon external source/drain contacts such that the first external source/drain contact is in contact with the first LDD substrate diffusion region and extends over at least a portion of the first field oxide isolation region, and the second external source/drain contact is in contact with the second LDD substrate diffusion region and extends over at least a portion of the second field oxide isolation region.

21. A method of fabricating external contacts in a bipolar transistor integrate circuit structure, wherein the integrated circuit structure includes first and second spaced-apart field oxide isolation regions formed in a silicon substrate to define an active device substrate base region having a first conductivity type therebetween, the base region being formed over a buried substrate collector region having a second conductivity type opposite the first conductivity type, and a third field oxide isolation region space-apart from the second oxide isolation region to define therebetween a region of the silicon substrate extending from a surface of the substrate to the buried collector substrate region, the method comprising:

(a) forming a layer of first polysilicon (poly1) on the above-described structure;

(b) introducing dopant of the second conductivity type into the poly1 layer;

(c) patterning the poly1 layer to define a first poly1 region on a surface of the substrate base region, the first poly1 region being spaced apart from the first and second field oxide regions, and a second poly1 region on the first surface of the substrate and extending from the second to the third field oxide regions;

(d) introducing dopant of the first conductivity type into the substrate base region adjacent the first poly1 region to define first and second extrinsic base regions of the bipolar transistor;

(e) forming oxide sidewall spaces on exposed sidewalls of the first and second poly1 regions;

(f) forming a layer of second polysilicon (poly2) on the structure resulting from step (e);

(g) introducing dopant of the first conductivity type into the poly2 layer;

(h) performing a chemical mechanical polishing step to remove first portions of the poly2 layer while leaving second and third portions of the poly2 layer in contact with the first and second extrinsic base regions, respectively; and (i) patterning the second and third portions of the poly2 layer to define first and second poly2 external contacts such that the first poly2 external contact is in contact with the first extrinsic base region and extends over at least a portion of the first field oxide isolation region, and the second poly2 external contact is in contact with the second extrinsic base region and extends over at least a portion of the second field oxide isolation region.

* * * * *